(12) United States Patent
Venkatachalam et al.

(10) Patent No.: US 8,155,246 B2
(45) Date of Patent: Apr. 10, 2012

(54) METHODS, APPARATUS, AND SYSTEMS FOR DETERMINING 1T PATH EQUIVALENCY INFORMATION IN AN NT IMPLEMENTATION OF A VITERBI DECODER

(75) Inventors: Kripa Venkatachalam, Fort Collins, CO (US); Brian K. Gutcher, Loveland, CO (US)

(73) Assignee: LSI Corporation, Milpitas, CA (US)

( * ) Notice: Subject to any disclaimer, the term of this patent is extended or adjusted under 35 U.S.C. 154(b) by 1118 days.

(21) Appl. No.: 11/966,833

(22) Filed: Dec. 28, 2007

(65) Prior Publication Data

US 2009/0168926 A1 Jul. 2, 2009

(51) Int. Cl.
*H04L 27/06* (2006.01)
(52) U.S. Cl. ........ 375/341; 375/361; 375/308; 375/350; 375/265
(58) Field of Classification Search .................. 375/341, 375/340, 261, 265, 308, 350; 714/786, 792, 714/794, 795
See application file for complete search history.

(56) References Cited

U.S. PATENT DOCUMENTS

| | | | |
|---|---|---|---|
| 6,445,755 B1 | 9/2002 | Chung et al. | |
| 6,484,283 B2 | 11/2002 | Stephen et al. | |
| 6,901,119 B2 | 5/2005 | Cideciyan et al. | |
| 6,999,532 B2 | 2/2006 | Kuo et al. | |
| 7,012,974 B1 | 3/2006 | Liu et al. | |
| 7,716,564 B2 * | 5/2010 | Yen et al. | 714/794 |
| 2005/0066259 A1 | 3/2005 | Park | |
| 2005/0268210 A1 | 12/2005 | Ashley | |

OTHER PUBLICATIONS

Hagenauer, J. et al.; *A Viterbi Algorithm with Soft-Decision Outputs and its Applications*; 1989; IEEE.
Black, Peter J. et al.; *A 140-Mb/s, 32-State, Radix-4 Viterbi Decoder*, IEEE Journal of Solid-State Circuits; Dec. 1992; pp. 1877-1885.
Yeo, Engling et al.; *500Mb/s Soft Output Viterbi Decoder*; ESSRIC 2002; pp. 523-526.
Yeo, Engling et al.; *500Mb/s Soft Output Viterbi Decoder*; IEEE Journal of Solid-State Circuits; Jul. 2003; pp. 1234-1241.

\* cited by examiner

*Primary Examiner* — Dhaval Patel
(74) *Attorney, Agent, or Firm* — Duft Bornsen & Fishman LLP

(57) ABSTRACT

Methods, apparatus, and systems for generating bit-wise path equivalency information corresponding to 1T decision nodes in a soft output Viterbi algorithm ("SOVA") decoder operating with an nT clock signal. An add, compare, select circuit (ACS) of the SOVA generates decision data for decision nodes 1T through nT responsive to each nT clock signal pulse. The decision data is applied to corresponding 1T through nT path equivalency detector circuits to generate 1T through nT path equivalency information for generation of soft output signals corresponding to the 1T through nT decision data.

11 Claims, 6 Drawing Sheets

4-State 2T Trellis 300

4-State 2T Trellis 400

Branch 1 402

404 Branch 2

MSB of a 2T step

LSB of a 2T step

METHODS, APPARATUS, AND SYSTEMS FOR DETERMINING 1T PATH EQUIVALENCY INFORMATION IN AN NT IMPLEMENTATION OF A VITERBI DECODER

RELATED PATENT APPLICATIONS

This patent application is related to U.S. patent application Ser. No. 11/696,300 filed 4 Apr. 2007 and entitled "METHODS, APPARATUS, AND SYSTEMS FOR DETERMINING 1T STATE METRIC DIFFERENCES IN AN nT IMPLEMENTATION OF A VITERBI DECODER" which is hereby incorporated by reference and is referred to herein as the "Sibling" patent application.

BACKGROUND

1. Field of the Invention

The invention relates to methods, apparatus, and systems utilizing soft output Viterbi algorithms in a digital channel decoder. More specifically the invention relates to methods, apparatus, and systems for determining 1T path equivalency information from an nT implementation of a soft output Viterbi decoder.

2. Discussion of Related Art

In most present digital communication channels, information is encoded in a manner to improve reliability of the transmitted information in the presence of imperfect or noisy communication channels. Exemplary of such communication channels are digital voice and data communication channels utilizing, for example, RF modulation for transmission of digital data. Another exemplary application of such digital channels are storage devices with read/write channels that write digital information using optical or magnetic modulation techniques for later recovery through a corresponding read channel.

One common decoding algorithm is known as the Viterbi algorithm. Broadly speaking, the Viterbi algorithm is a dynamic programming algorithm that determines the most likely sequence of states that result in a sequence of observed events in the received signal. This most likely sequence of states then defines the decoded symbol based on the path of most likely values of the observed events. In general, the Viterbi decoder determines the most likely transmitted sequence of encoded data bits that may be the underlying cause of an observed sequence of sensed events. In other words, the Viterbi decoder determines the most likely sequence of encoded data bits represented by a received sequence of modulated events.

Improvements to the Viterbi algorithm known as the soft output Viterbi algorithm ("SOVA") improve upon prior algorithms by including reliability or probability information for each decoded bit of the decoded symbol and, by accumulating this bit-wise reliability or probability information, a reliability or probability value associated with the most likely decoded symbol can be generated. Basic concepts of the SOVA techniques and common applications thereof are well known to those of ordinary skill in the art and are notoriously disclosed by Hagenauer and Hoeher in 1989 in the paper entitled "A Viterbi Algorithm With Soft-Decision Outputs and its Applications" (IEEE 1989 and incorporated herein by reference). The SOVA algorithms utilize branch metric information associated with each branch from the first state to each of two subsequent, potential follow-on states to determine the most likely branch for a next sensed event. Hagenauer and Hoeher first taught that the difference in accumulated branch metric information between the most likely and second most likely paths of the Viterbi detector in response to each sensed event is a useful approximation of the log-likelihood ratio ("LLR") used in the SOVA techniques to determine reliability of the surviving path (e.g., reliability of the decoded bit). This state metric difference ("SMD") is therefore used to implement SOVA techniques in present Viterbi decoders.

Those of ordinary skill in the art will readily recognize that the state metric and branch metric information discussed herein is also more simply referred to herein as "metric information" or as "path metric information".

In earlier Viterbi algorithm state machines, each bit or received event is received or sensed on a corresponding cycle of an applicable clock signal. The clock signal generally cause a transition of the state machine to determine the most likely bit value for the sensed event based on past sensed events and corresponding branch metric information. In other words, each clock cycle of the Viterbi algorithm state machine corresponds to decoding of one bit of the encoded symbol. Branch metric information is therefore encoded in association with each possible transition corresponding to each clock cycle operable in the Viterbi algorithm state machine. Such Viterbi decoders in which each clock pulse corresponds to processing of one As the data rate (e.g., "baud" rate) for application of Viterbi decoders has increased, many present day decoders utilized a "2T" decoder structure such that each clock cycle decodes a sequence of two consecutive bits of the encoded symbol. Such a 2T decoder implementation has four possible transitions from a current state to a next state based upon a sensed event representation of two encoded bits. Thus the clock rate of the Viterbi decoder state machine is typically half that of the data/baud rate of transmitted information. More generally, modern Viterbi decoders may utilize a clock rate whose frequency is an integer fraction of the corresponding data rate. In other words, an "nT" Viterbi decoder may use a clock that has a frequency of 1/n times the data rate. Thus each clock pulse in an nT Viterbi decoder represents n bits of the symbol to be decoded. An nT Viterbi decoder is therefore operable in accordance with an nT state machine.

The Sibling patent application teaches methods and apparatus for generating 1T path metric information from an nT Viterbi decoder design. A paper by Yeo et al entitled "500 Mb/s Soft Output Viterbi Decoder" (ESSCIRC 2002; pp. 523-526—hereinafter "Yeo" and hereby incorporated by reference) presents a 1T SOVA decoder design. The 1T SOVA design of Yeo includes a path equivalency detector ("PED") component that identifies dissimilarities of decisions feeding into each decision node. As known to those of ordinary skill in the art, the PED generates a logic high signal if the competing bits applied to its inputs are the same and generates a logic low signal if the applied bits are different. The PED output signals are applied to control update of the LLR determination at each clock. However, to update the appropriate LLR values in an nT Viterbi design it is necessary to know the equivalency bit at each decision node (i.e., at each 1T decision node) rather than just at each clock pulse (i.e., at each nT clock pulse).

It is evident from the above discussion that an ongoing need exists to usefully apply SOVA techniques in an nT state machine implementation of a Viterbi decoder to provide 1T path equivalency information for the nT SOVA implementation.

SUMMARY

The present invention solves the above and other problems, thereby advancing the state of the useful arts, by providing methods and structure for determining 1T through nT path equivalency information in an nT implementation of a Viterbi decoder. The path equivalency information may then be utilized in well-known SOVA methods within the Viterbi decoder to produce higher quality reliability/probability information for the decoder output.

One aspect provides a method for generating 1T path equivalency information in a soft output Viterbi algorithm (SOVA) decoder configured for use with an nT clock signal where n is greater than 1. The method performs the following steps responsive to each nT clock pulse. A first step entails applying decision data from an add, compare, select (ACS) component of the SOVA decoder to n path equivalency detector (PED) components of the SOVA decoder. The method next generates path equivalency information from each of the n PED components wherein each of the n PED components generates a corresponding one of 1T path equivalency information through nT path equivalency information. The method then includes utilizing the path equivalency information from each of the n PED components to generate soft output information associated with the decision data output of the SOVA decoder.

Another aspect hereof provides a soft output Viterbi algorithm (SOVA) decoder operable using an nT clock signal where n is greater than 1, the SOVA decoder comprising an add, compare, select (ACS) component adapted to receive n input signals and adapted to generate n decision data output signals corresponding to 1T through nT decision nodes. The SOVA decoder further comprises n path equivalency detector (PED) circuits (PED1 through PEDn) each coupled to receive a corresponding one of said decision data output signals from the ACS and each adapted to generate a corresponding one of n path equivalency output signals in response to each pulse of said nT clock. The SOVA detector further includes a reliability measurement unit circuit coupled to receive the n path equivalency output signals and adapted to generate n soft output signals in response to each pulse of said nT clock based on the n path equivalency output signals wherein each of said n soft output signals is output with a corresponding one of said n decision data output signals.

DETAILED DESCRIPTION OF THE DRAWINGS

Figure 1:
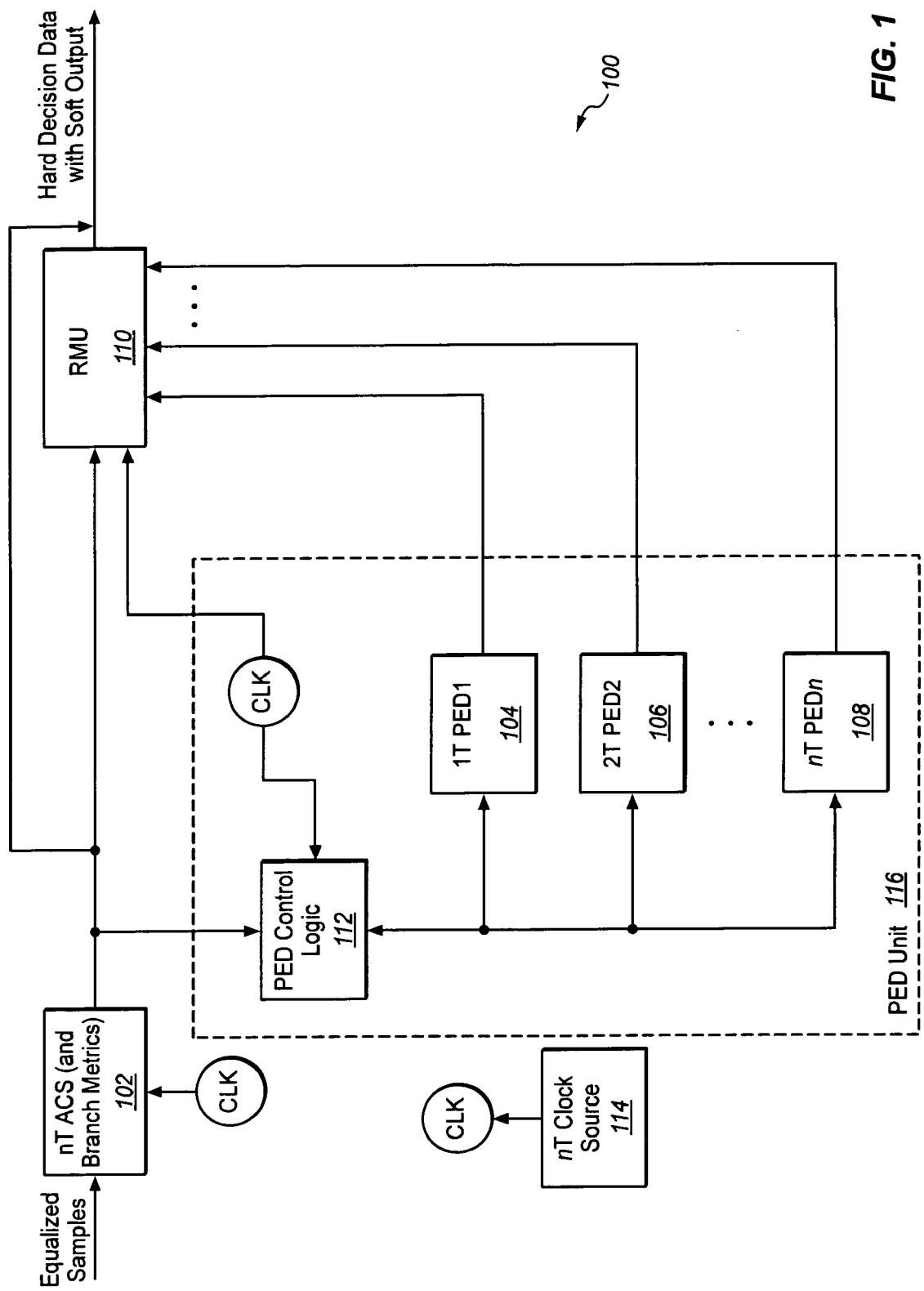
FIG. 1 is a block diagram of an exemplary SOVA decoder enhanced in accordance with features and aspects hereof to generate 1T path equivalency information while operating with an nT clock.

FIG. 1 is a block diagram of an exemplary SOVA decoder 100 enhanced in accordance with features and aspects hereof to provide 1T equivalent path equivalency information for generating soft output signals while operating in accordance with a clock operating at a fraction of the intended data throughput rate. Clock source 114 provides a ubiquitous clock for the SOVA decoder 100 operating using an nT clock signal. In other words, every clock signal from clock source 114 initiates processing of n input signals (equalized samples) to generate a corresponding hard decision data output signals with corresponding soft output signals. Such a decoder is referred to herein as an nT SOVA decoder. Further, the various components of SOVA decoder 100 may be referred to as "nT" components. In one exemplary preferred embodiment, "n" may be 2 such that the SOVA decoder 100 is referred to as a 2T SOVA decoder and the components thereof may be referred to as 2T components. nT add, compare, select (ACS) component 102 receives equalized samples the from a sample source (not shown) of such discrete time sample values. Equalized samples are generated by sampling and filtering a continuous analog signal. The continuous signal may be generated by sensing modulations of magnetic or optical properties of a medium (such as in magnetic or optical storage devices) or as modulations of an electromagnetic signal (e.g., a radio frequency signal) used to encode digital data for transmission. The filtering and pre-processing (not shown) to sample and equalize the sensed samples are well known to those of ordinary skill in the art.

Responsive to each clock pulse from nT clock source 114, ACS 102 generates decision nodes (hard decision data) and associated branch metric information for all decision nodes (time intervals) ranging from time intervals 1 through n processed at the current nT clock signal pulse from nT clock source 114. In other words, ACS 102 is adapted to generate hard decision data and associated branch metrics for decision nodes corresponding to time intervals of 1T, 2T . . . through nT. The related Sibling patent application noted above provides exemplary details of such an ACS unit adapted to generate 1T equivalent decision node data from an nT (e.g., 2T) ACS design in a Viterbi decoder.

The decision node data (e.g., hard decision data) so generated by ACS 102 is applied to path equivalency detector (PED) unit 116 which, in turn, generates path equivalency information applied to reliability measurement unit (RMU) 110. RMU 110, as generally known in the art, utilizes the received path equivalency information in conjunction with the hard decision data to generate soft output signals to be used in combination with the hard decision data as the desired output of SOVA detector 100. Though RMU 110 is shown as clocked by the same ubiquitous nT clock signal, those of ordinary skill in the art will recognize that RMU 110 may also operate using a 1T clock signal (not shown) for generation of its soft output signals. Thus it may receive 1T through nT input signals once at each nT clock pulse but may generate its soft output signals based on a separate 1T clock signal (not shown).

PED unit 116, in accordance with features and aspects hereof, includes PED control logic 112 for receiving the hard decision data and applying the 1T through nT decision data to the corresponding plurality of PEDs 104 through 108. In other words, 1T decision data is applied to 1T PED1 104; 2T decision data is applied to 2T PED2 106, and so on through nT decision data being applied to nT PEDn 108. As discussed in additional detail below, PED control logic 112 also copies or transfers information from the nT PEDn 108 into each of the other PEDs 104 through 106 just prior to applying the nT clock pulse to each of the PEDs 104 through 108. The state information so transferred prepares in each of the PEDs 1T through (n−1)T to compute its associated path equivalency information based on the current state of path equivalency computations at completion of the previous nT clock signal pulse.

RMU 110 monitors and updates log likelihood ratio (LLR) information based on the hard decision information received from ACS 102 (e.g., path metric information and hard decision data) and based on the path equivalency information for decision nodes 1T through nT received from PED unit 116. Details of operation of RMU 110 are generally known to those of ordinary skill in the art and are beyond the scope of the present invention. For example, Yeo teaches one exemplary embodiment of an RMU adapted for processing path equivalency information to generate soft outputs. RMU 110 receives hard decision data (and path metric information) from ACS 102 and path equivalency information from PED 116 sufficient to generate corresponding soft output signals associated with the applied hard decision data.

The hard decision data generated by ACS 102 and the soft output signals from RMU 110 corresponding to each of the hard decisions data values is then applied to some utilization circuit (not shown) to utilize the decoded hard data and the probability information represented as the soft output signals corresponding to the hard decision data.

Those of ordinary skill in the art will readily recognize the omission in FIG. 1 of appropriate FIFO and/or register exchange circuits to assure coordination and alignment of the hard decision data and associated path equivalency information as the various elements of data are clocked through the SOVA detector 100. Thus appropriate FIFOs, registers, and/or other related memory and logic components may be utilized as well known in the art to provide requisite alignment and synchronization of the various data elements generated and utilized within SOVA decoder 100. Such elements are omitted from FIG. 1 merely for brevity and simplicity of the description of the features and aspects hereof.

Figure 2:
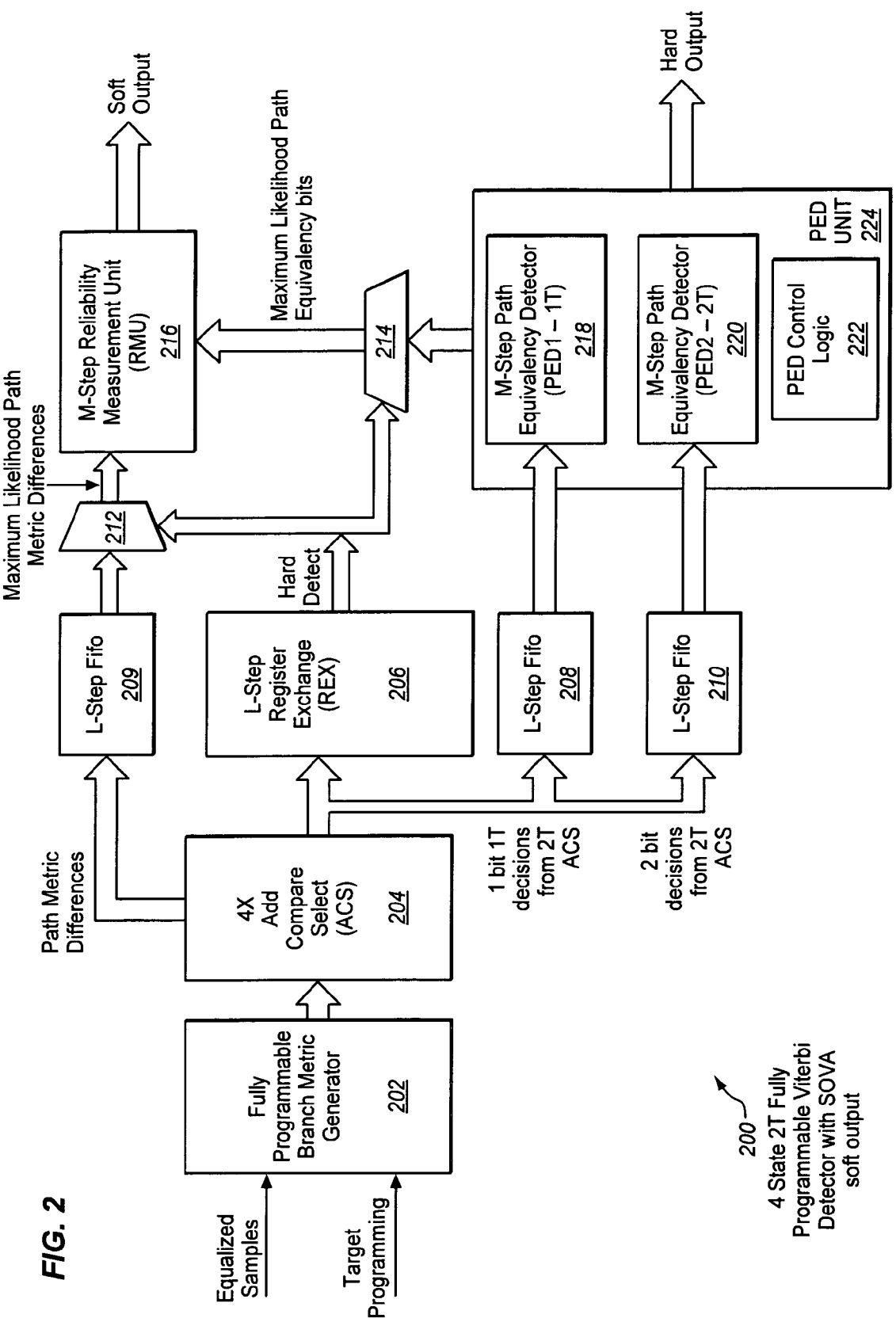
FIG. 2 is a block diagram of another exemplary SOVA decoder enhanced in accordance with features and aspects hereof to generate 1T equivalent path equivalency information while operating with a 2T clock.

FIG. 2 is a block diagram of an exemplary SOVA decoder 200 implemented as a 4-state, 2T circuit processing two equalized samples on each clock pulse and generating both hard output and associated soft output signals utilizing the enhanced PED features hereof. Equalized samples and target programming information (e.g., defining speed versus accuracy tradeoffs to be applied in SOVA detector 200) are applied to programmable branch metric generator 202 to generate branch metric information for 2T SOVA decoder 200. The equalized samples and associated branch metric information are then applied to the ACS unit 204 to generate 1T and 2T decision node data. The hard decision data generated by ACS 204 is applied to register exchange 206 to allow for alignment with path equivalency data used in reliability measurement. The design choice for a desired depth of the L-step ("lock step") alignment of information is a well known function of the accuracy required to decode symbols in view of inter-symbol interference (ISI) of the particular encoded medium. For example, a first L-step depth may be useful for decoding of symbols from a magnetic storage medium while a different depth may be optimal for decoding of optically transmitted or transduced encoded symbols. Register exchange 206 along with FIFOs 208, 209, and 210 assure alignment of the various signals that are processed in lock-step with a depth determined by the decoding requirements of the application. Path metric difference information generated by ACS 204 is applied through an L-step deep FIFO 209 and through multiplexer 212 to RMU 216 to generate corresponding soft output signals. In the 4-state exemplary implementation shown in FIG. 2, four possible path metric differences are applied through FIFO 209 as inputs to multiplexer 212. The hard decision data generated by ACS 204 through REX 206 is then applied as selection control inputs to multiplexer 212.

In like manner, 1T and 2T hard decision data generated by ACS 204 is applied through L-step deep FIFOs 208 and 210, respectively, to PEDs 218 and 220, respectively, in PED unit 224. In particular, under control of PED control logic 222, 1T decision data is applied to 1T PED1 218 while 2T decision data is applied to 2T PED2 element 220. As described further herein below, PED1 218 generates 1T path equivalency information responsive to each 2T clock pulse while 2T PED 220 generates 2T path equivalency information responsive to each 2T clock pulse. Further, as discussed herein below, just prior to each 2T clock pulse as applied to PEDs 218 and 220, the state information contained within the flip flops of PED2 220 is copied into corresponding flip flops of PED1 218. PED control logic 222 performs the appropriate mapping of flip flops in PED2 to corresponding flip flops in PED1. Following the copying of information from PED2 220 to PED1 218, 1T and 2T decision data is applied through FIFOs 208 and 210 as inputs to PEDs 218 and 220, respectively. PED control logic 222 may then apply a clock signal to PEDs 218 and 220 to generate a next step of path equivalency information.

The path equivalency information generated by PED unit 224 comprises four possible states (since the exemplary embodiment of FIG. 2 is a 4-state decoder). The four possible states are applied through multiplexer 214 under selective control of register exchange 206 for use by RMU 216 in generating soft output signals corresponding to the hard output decision data generated by the ACS 204. PED1 218 and PED2 220 are shown as "M-step" path equivalency detectors with reference to the depth of equivalency analysis performed. As above with respect to the "L-step" depth, the "M-step" depth may be determined as a well known matter of design choice for the particular application. In general, deeper path equivalency analysis provides more robust path equivalency information and hence more reliability in the soft output signals generated by RMU 216 but at a cost of more complex, power and space consuming circuitry.

Figure 3:
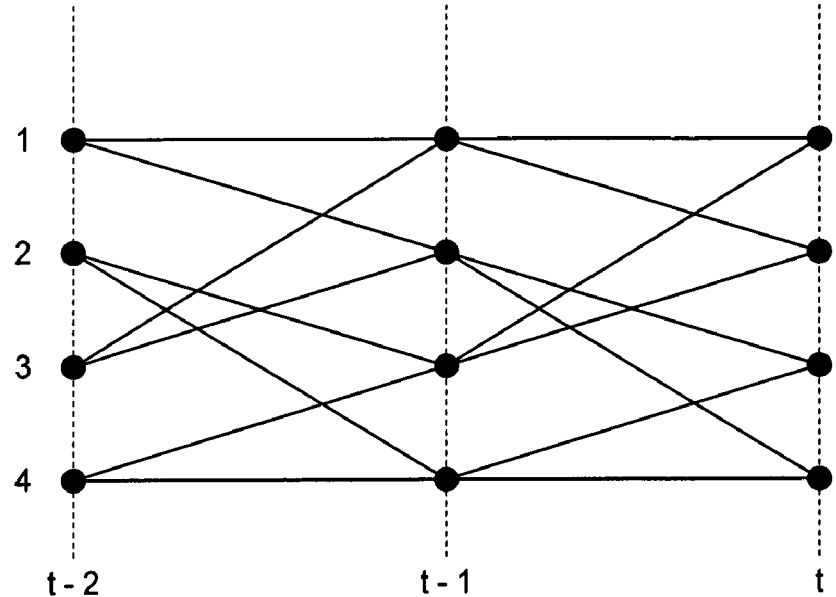
FIG. 3 depicts a typical, exemplary Trellis diagram of transitions of a 4-state, 2T Viterbi decoder.

FIG. 3 is a Trellis diagram as commonly used to represent state transitions in Viterbi sequence detectors. The Trellis 300 of FIG. 3 represents a standard 4-state, 2T Trellis diagram representing all possible paths in transitioning through a single 2T clock pulse from time "t−2" up to time "t". The intermediate decision node at time "t−1" is determined as discussed above by computational methods but does not correspond to a particular clock signal pulse. Rather, the transitions and associated metrics at time "t−1" are calculated in response to receipt of the single 2T clock signal pulse.

Figure 4:
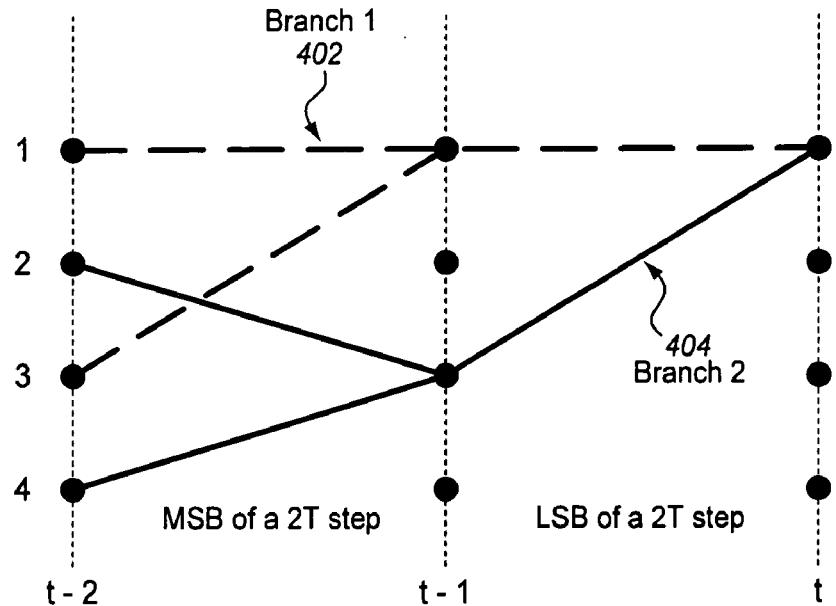
FIG. 4 depicts a portion of transitions of an exemplary Trellis diagram of transitions of a 4-state, 2T Viterbi decoder and notes the association of most significant and least significant bits as used in path equivalency information generation in accordance with features and aspects hereof.

FIG. 4 is a Trellis diagram representing exemplary transitions through a 4-state, 2T Trellis 400. Branch 1 402 is represented as dashed lines transitioning from either state "1" or state "3" at time "t−2" into state "1" at time "t−1" and thence to state "1" at time "t". Branch 2 404 is shown as a solid sequence of lines transitioning from either state "2" or state "4" at the time "t−2" to state "3" at time "t−1" and thence to the state "1" at time "t". Thus, the most significant bit (MSB) of a two bit state transition through the Trellis diagram in response to a single 2T clock signal pulse represents the possible transitions from an initial state at "t−2" into a next intermediate state at time "t−1". In like manner the LSB (least significant bit) of the 2T step in the Trellis 400 of FIG. 4 represents one of two possible transitions from either state "1" or state "3" at time "t−1" into state "1" at time "t". As will be seen in further discussions herein below, only the LSB of each transition as presented to each PED component is used within the structure of the corresponding PED in accordance with features and aspects hereof. Thus each PED that analyzes corresponding 1T through nT path equivalency focuses its respective analysis on the LSB of the state input signals of the various possible states it serves to analyze.

Figure 5:
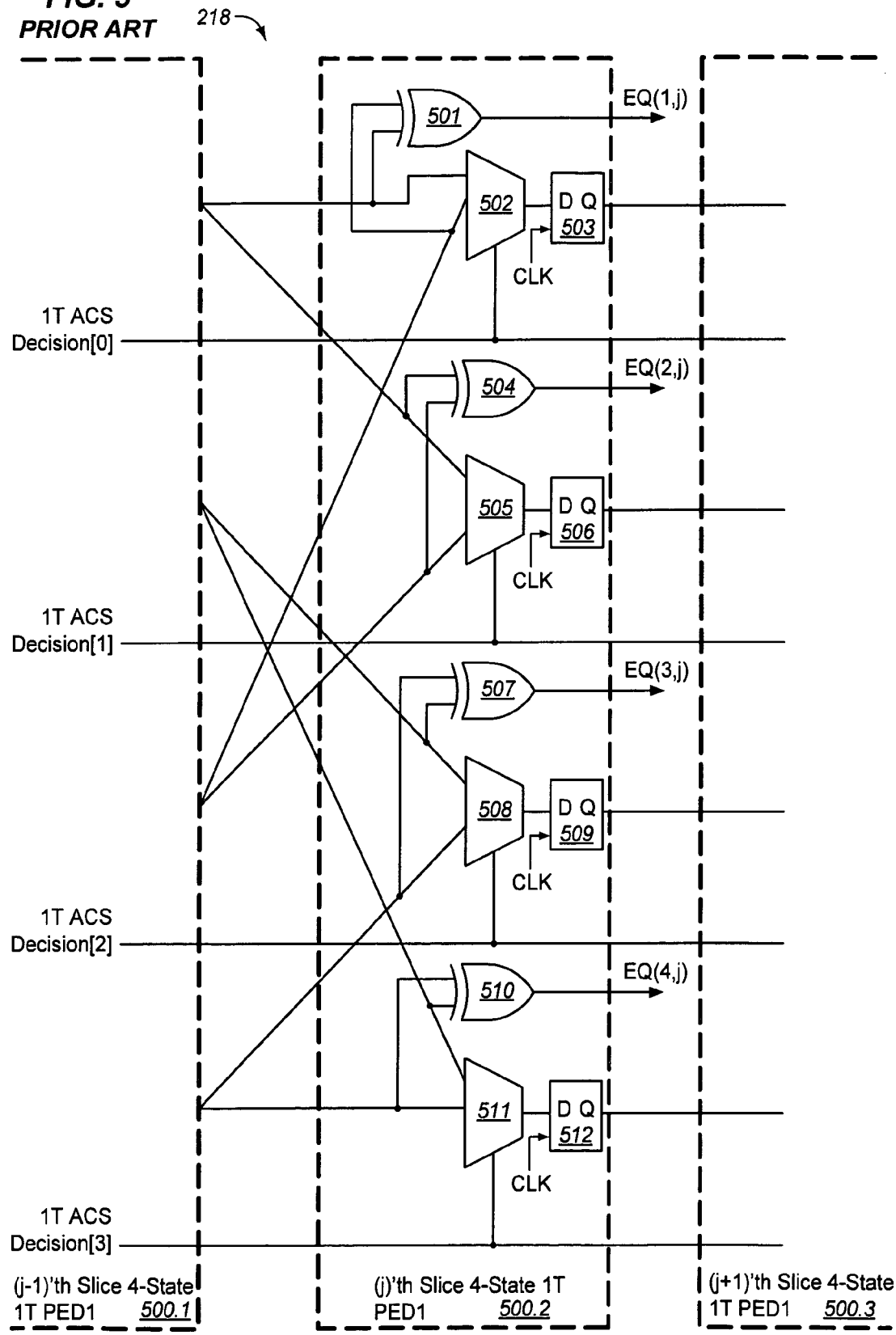
FIG. 5 is an exemplary circuit diagram of a slice of a 1T path equivalency detector as presently known in the art.

FIG. 5 is a circuit diagram of an exemplary path equivalency detector as presently practiced in the art for generation of 1T path equivalency information. As generally known to those of ordinary skill in the art, PED 218 is adapted to process 1T decision nodes from an ACS element. Such a PED generally comprises a sequence of connected slices or steps (e.g., "M" steps as exemplified in FIG. 2) each of identical design and each feeding its latched output to the next slice for processing responsive to each applied clock pulse. The number of such slices is a matter of design choice determined by the depth of the paths for which equivalency is to be determined. As noted above, the depth (length) of the path equivalency analysis is a matter of design choice well known to those of ordinary skill in the art to tradeoff improved reliability against circuit complexity and power consumption. At each slice "j", equivalency output signals may be generated. FIG. 5 represents an exemplary slice "j" 500.2 of a 4-state, 1T PED such as PED1 218 of FIG. 2. Four input signals (corresponding to four possible states) from the prior slice "(j−1)" 500.1 are selectively applied as inputs to multiplexers 502, 505, 508, and 511. Four 1-bit ACS decision node values are also received as input to slice "j" 500.2 and applied to the multiplexers (502, 505, 509, and 511) for selection control between the applied inputs of the multiplexers. The output of each multiplexer is then applied as an input to its corresponding flip flop 503, 506, 509, and 512, respectively.

Upon application of a clock signal, each flip flop 503, 506, 509, and 512 applies its current stored status to its corresponding output which is then applied as input to a next slice "j+1" 500.3 of the 1T PED. However, as discussed herein, the contents of all flip flops for the 1T PED 218 are pre-set just prior to each 2T clock pulse. In particular, the contents of corresponding flip flops in the 2T PED (discussed below) are copied to the flip flops of PED1 218. In addition, at each 2T clock pulse each slice generates its corresponding path equivalency output signals utilizing XOR gates 501, 504, 507, and 510 coupled to each of the two inputs attached to the corresponding multiplexers 502, 505, 508, and 511, respectively. XOR gates 501, 504, 507, and 510 therefore generate path equivalency outputs EQ(1,j) through EQ(4,j). Each XOR gate receives selected input signals depending on the decoding to be performed as exemplified by the Trellis diagram of FIG. 4. The 1T PED of this FIG. 5 thus analyzes the first sequence of possible transitions from time "t−2" to time "t−1" of the Trellis diagram of FIG. 4 (e.g., the most significant bits of the 2T transitions depicted by the Trellis diagram of FIG. 4).

Figure 6:
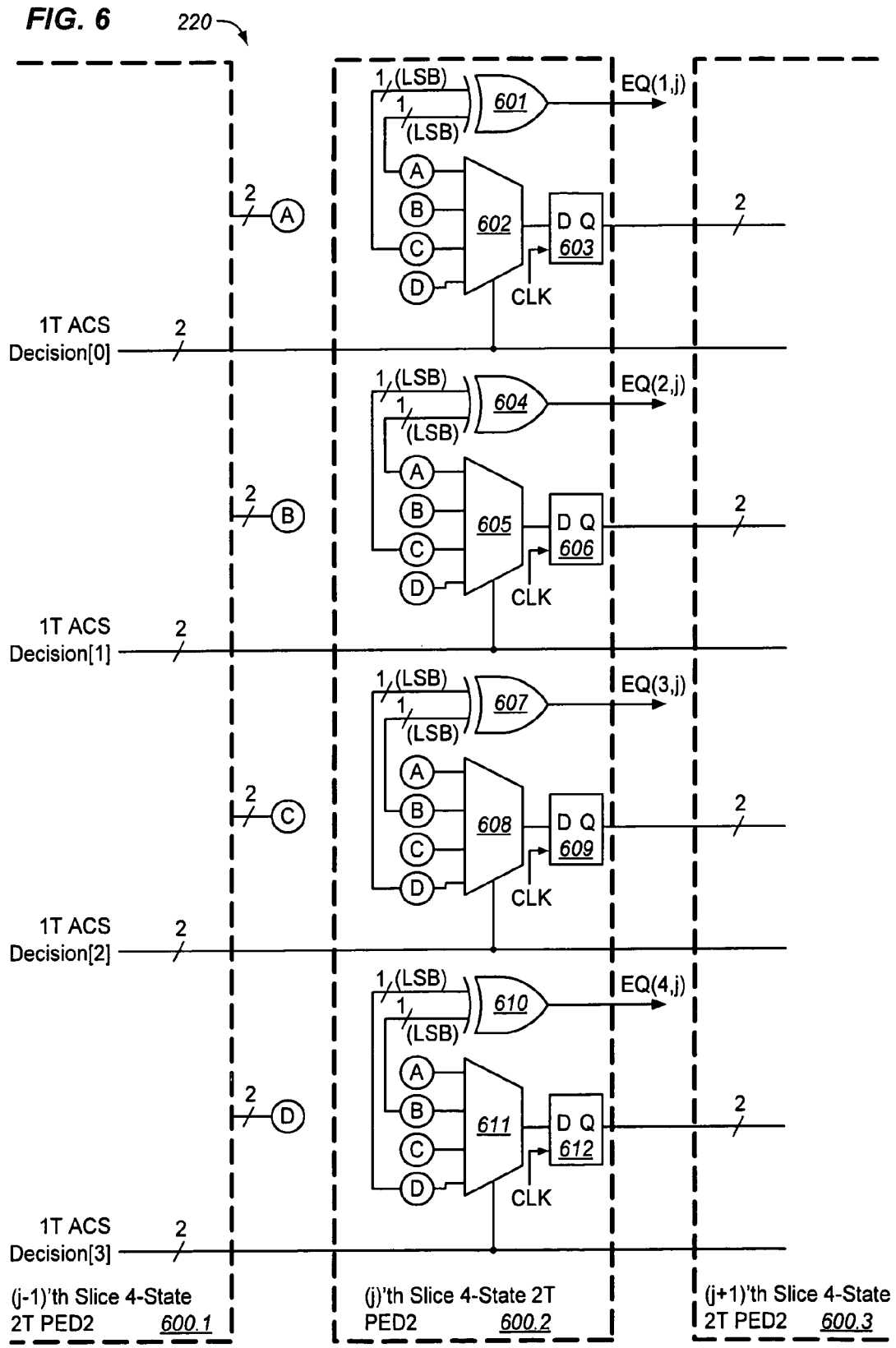
FIG. 6 is an exemplary circuit diagram of a slice of a 2T path equivalency detector in accordance with features and aspects hereof.

FIG. 6 depicts an exemplary circuit embodying a 2T PED such as PED2 220 of FIG. 2. As with the 1T PED of FIG. 5, four inputs are received in the depicted slice "j" 600.2 generated by a prior slice "j−1" 600.1 and labeled A, B, C, and D. It will be noted that since this PED 220 processes 2T decision data, each input provides two bits. Thus the data paths labeled A, B, C, and D are all 2-bit wide data paths. Still further, four ACS decision inputs are provided to each slice of the 2T PED 220. Again because the data processed is 2T decision data, each ACS decision value 0 through 3 is a 2-bit wide path. Inputs A through D are then applied to each of four multiplexer elements 602, 605, 608, and 611, respectively. The ACS decision node data 0 through 3 are then applied to multiplexers 602, 605, 608, and 611 to permit selection among the four input signal paths (A through D). The selected input signal is then applied as output from each multiplexer 602, 605, 608, and 611 as input to a corresponding flip flop 603, 606, 609, and 612, respectively, again as a 2-bit wide path in a flip flop structure storing two bits. Responsive to an appropriate clock signal, each flip flop 603, 606, 609, and 612 applies its current stored 2-bit value to its output signal path (also 2-bits wide) as the "A" through "D" inputs, respectively, of the next slice "j+1" 600.3.

In addition, as above in discussion of PED 218, slice "j" 600.2 generates four path equivalency bits the using XOR gates 601, 604, 607, and 610. Each XOR gate generates its corresponding path equivalency information bit EQ(1,j) through EQ(4,j), respectively. Since the path equivalency information generated in this 2T PED 220 corresponds to the ending time of a 2T clock pulse, only the least significant bit (LSB) of the data paths applied as inputs to the XOR gates are used to generate the desired path equivalency information for the end of this 2T time interval. The path equivalency information corresponding to the intermediate 1T decision node is generated by the 1T PED 218 as discussed above. As above with respect to FIG. 5, the XOR gates of FIG. 6 are selectively coupled to determine equivalency for the decoding as represented by the exemplary Trellis diagram of FIG. 4. Specifically, the 2T PED of this FIG. 6 thus analyzes the second sequence of possible transitions from time "t−1" to time "t" of the Trellis diagram of FIG. 4 (e.g., the least significant bits of the 2T transitions depicted by the Trellis diagram of FIG. 4).

Those of ordinary skill in the art will recognize that since each PED (1T through nT) performs its respective path equivalency analysis based on the LSB of the possible states applied, the exemplary circuitry of FIGS. 5 and 6 may be simplified to eliminate redundant XOR comparisons of the LSB applied. Further, those of ordinary skill will readily recognize that the order of hard decision data bits applied to each PED may be reversed as a matter of design choice. Thus the MSB of the applied hard decision data may be utilized. Such bit "endian" design choices are well known to those of ordinary skill in the art.

Figure 7:
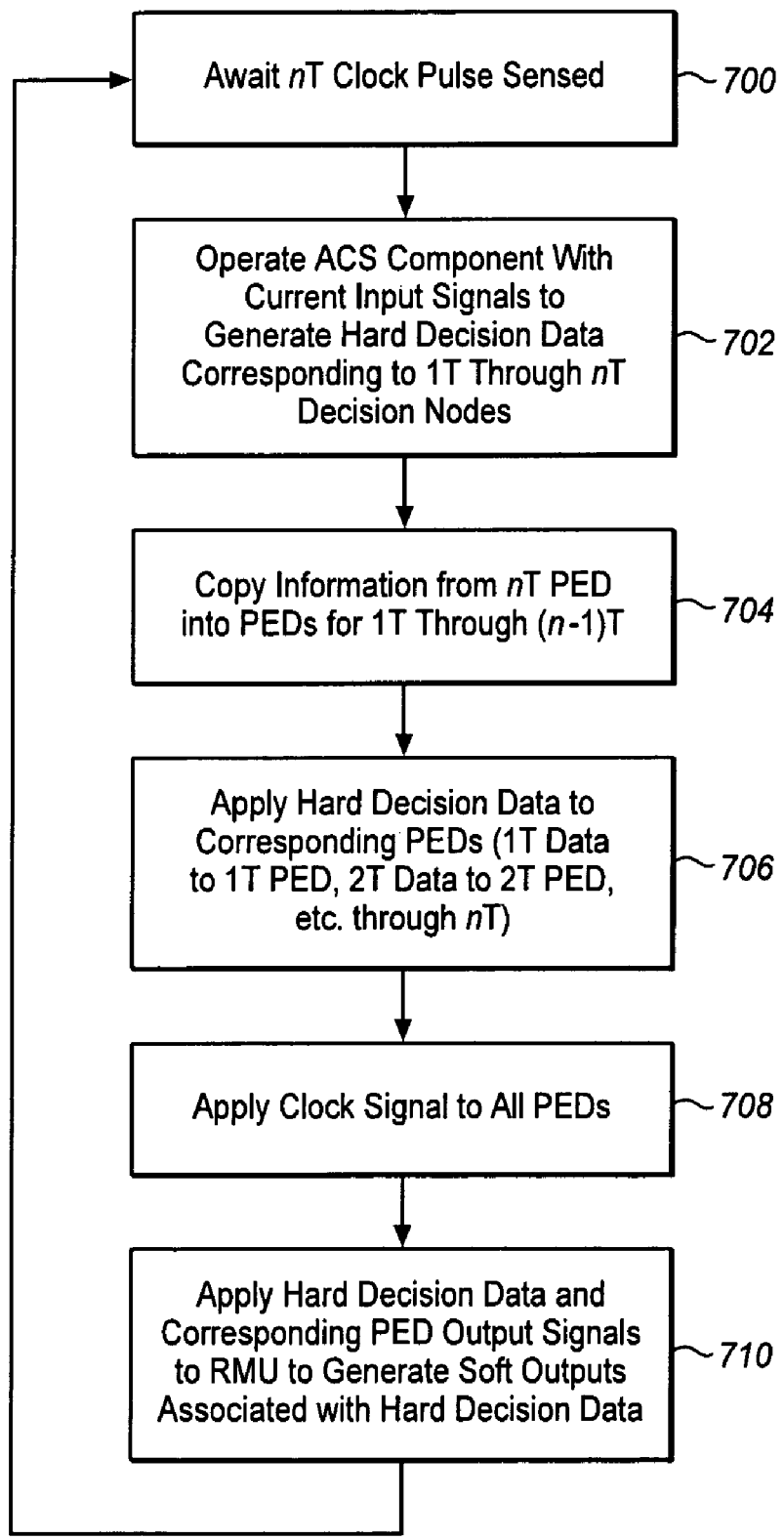
FIG. 7 is a flowchart describing operation of an nT SOVA decoder to generate 1T equivalent path equivalency information in accordance with features and aspects hereof.

FIG. 7 is a flowchart describing overall operation of the SOVA decoder enhanced in accordance with features and aspects hereof to provide 1T equivalent path equivalency information in an nT SOVA decoder implementation. In general, the SOVA decoder operates in response to each pulse of an nT clock signal. Step 700 awaits detection of a next pulse of the nT clock signal. Upon detection of the next pulse, step 702 operates the ACS component of the SOVA detector with the current equalized sample input signals applied to the ACS. The ACS operates to generate decision data (and associated branch metric data) corresponding to 1T through nT decision nodes that follow the decision nodes of the previous clock pulse. Step 704 next copies information from the PED adapted for processing the nT path equivalency information into each of the other PEDs corresponding to 1T through (n−1)T decision nodes. The information copied is generally all information stored in the flip flops of the nT PED. Each PED is configured to generate the same number of path equivalency steps determined as a matter of design choice. Thus each PED has the same number of flip flops though they may be organized in a different manner. For example, each slice in a 2T PED provides eight stored bits while each slice in a 1T PED stores four bits in its corresponding flip flops. Thus, the eight stored bits in a 2T PED slice may be distributed over multiple slices in a 1T slice. In like manner, the data stored within the flip flops of an nT slice may be distributed over portions of one or more slices in each of the other PEDs adapted to generate 1T through (n−1)T path equivalency information. Those of ordinary skill in the art will readily recognize a variety of mappings of the stored information in the flip flops of an nT PED to be distributed over corresponding flip flops in each of the PEDs adapted for 1T through (n−1)T path equivalency information generation.

Step 704 essentially advances each of the 1T through (n−1)T PEDs up to the state associated with the last nT clock pulse signal as defined by the state of the nT PED. Step 706 then applies the hard decision data (and corresponding branch metric information) was to corresponding PEDs. In other words, 1T decision data is applied to a corresponding 1T PED, 2T decision data is applied to a corresponding 2T PED etc. through nT decision data applied to a corresponding nT PED. As noted above, a PED control logic element may control and coordinate the application of the various decision data elements to appropriate, corresponding PEDs. Step 708 applies a clock signal to all PEDs causing each to generate its corresponding path equivalency information. In other words, the clock pulse applied to a 1T PED advances it 1T decision nodes from its current starting point initialized to the end of the previous nT clock signal pulse. In like manner, the 2T PED through nT PED are each advanced to their corresponding next decision node at which appropriate path equivalency information corresponding to that next decision node is generated. Put another way, each XT PED where X spans from 1 through n, is advanced to its corresponding next decision node at time interval X. As noted above, a PED control logic element may be provided to appropriately defer clock signals applied to the PEDs. In general, step 704 and step 706 should be completed prior to the operation of step 708 to apply a clock signal to each PED to generate its respective path equivalency information. Lastly, element 710 is operable to apply the hard decision data generated by operation of the ACS and corresponding path equivalency information from the PEDs to a reliability measurement unit (RMU) and thence apply a clock signal to the RMU to cause generation of associated soft output signals associated with the hard decision data. Those of ordinary skill in the art will readily recognize further details of the operation of an RMU to generate desired soft output signals corresponding to associated hard decision data. Further, as noted above, appropriate buffering and/or FIFOs may be utilized to assure proper alignment of the generated soft output signals and associated hard decision data. Processing of the method then continues looping back to step 700 to await detection of the next nT clock pulse signal.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A method for generating 1T path equivalency information in a soft output Viterbi algorithm (SOVA) decoder configured for use with an nT clock signal where n is greater than 1, the method comprising:
    responsive to each nT clock pulse, performing the steps of:
        applying decision data from an add, compare, select (ACS) component of the SOVA decoder to n path equivalency detector (PED) components of the SOVA decoder;
        generating path equivalency information from each of the n PED components wherein each of the n PED components generates a corresponding one of 1T path equivalency information through nT path equivalency information; and
    utilizing the path equivalency information from each of the n PED components to generate soft output information associated with the decision data output of the SOVA decoder.

2. The method of claim 1
    wherein the decision data includes 1T decision data through nT decision data generated by the ACS on each nT clock pulse, and
    wherein the step of applying further comprises applying XT decision data to a PED that generates the corresponding XT path equivalency information for each X from 1 through n.

3. The method of claim 1 further comprising:
    prior to the step of generating responsive to said each nT clock pulse, copying information in the PED component that generates the nT path equivalency information to all other PED components.

4. The method of claim 1 wherein n is 2.

5. The method of claim 1
    wherein the step of generating path equivalency information further comprises:
    generating path equivalency information from each of the n PED components wherein each of the n PED components generates a corresponding one of 1T path equivalency information through nT path equivalency information and wherein each of the n PED components comprises a plurality of slices and wherein each slice generates its path equivalency information based on analysis of the least significant bit of input signals applied thereto.

6. A soft output Viterbi algorithm (SOVA) decoder operable using an nT clock signal where n is greater than 1, the SOVA decoder comprising:
    an add, compare, select (ACS) component adapted to receive n input signals and adapted to generate n decision data output signals corresponding to 1T through nT decision nodes;
    n path equivalency detector (PED) circuits (PED1 through PEDn) each coupled to receive a corresponding one of said decision data output signals from the ACS and each adapted to generate a corresponding one of n path equivalency output signals in response to each pulse of said nT clock; and
    a reliability measurement unit circuit coupled to receive the n path equivalency output signals and adapted to generate soft output signals based on the n path equivalency output signals.

7. The SOVA decoder of claim 6 further comprising:
    logic responsive to each pulse of said nT clock pulse and operable in advance of operation of said PED1 through PEDn to copy information within said PEDn into each of PED1 through PEDn−1.

8. The SOVA decoder of claim 6 wherein n is 2.

9. A method for operating a soft output Viterbi algorithm (SOVA) decoder designed to utilize a 2T clock signal, the method comprising:
    operating an add, compare, select (ACS) circuit of the SOVA decoder in response to each pulse of a 2T clock signal wherein the ACS receives 2 input signals and generates first decision data corresponding to a 1T decision node and generates second decision data corresponding to a 2T decision node;

applying the first decision data to a first path equivalency detector circuit (PED1) of the SOVA decoder;

applying the second decision data to a second path equivalency detector circuit (PED2) of the SOVA decoder;

operating PED1 and PED2 responsive to each pulse of said 2T clock signal to generate a first path equivalency output signal corresponding to said 1T decision node and to generate a second path equivalency output signal corresponding to said 2T decision node;

applying the first and second path equivalency output signals to a reliability measurement unit circuit (RMU) of the SOVA decoder; and operating the RMU to generate a first soft output signal corresponding to said 1T decision node and to generate a second soft output signal corresponding to said 2T decision node.

10. The method of claim 9 further comprising:

prior to applying said first decision data to PED1 and prior to applying said second decision data to PED2, copying information from PED2 to PED1.

11. The method of claim 9 wherein the step of operating PED1 and PED2 further comprises:

generating path equivalency information from PED2 wherein PED2 comprises a plurality of slices and wherein each slice generates its path equivalency information based on analysis of the least significant bit of said second decision data.

* * * * *